Aug. 31, 1965 W. BACHNICK 3,204,198
CIRCUIT ARRANGEMENT FOR CHANGING THE OSCILLATOR FREQUENCY OF UHF TUNERS
Filed Dec. 5, 1960
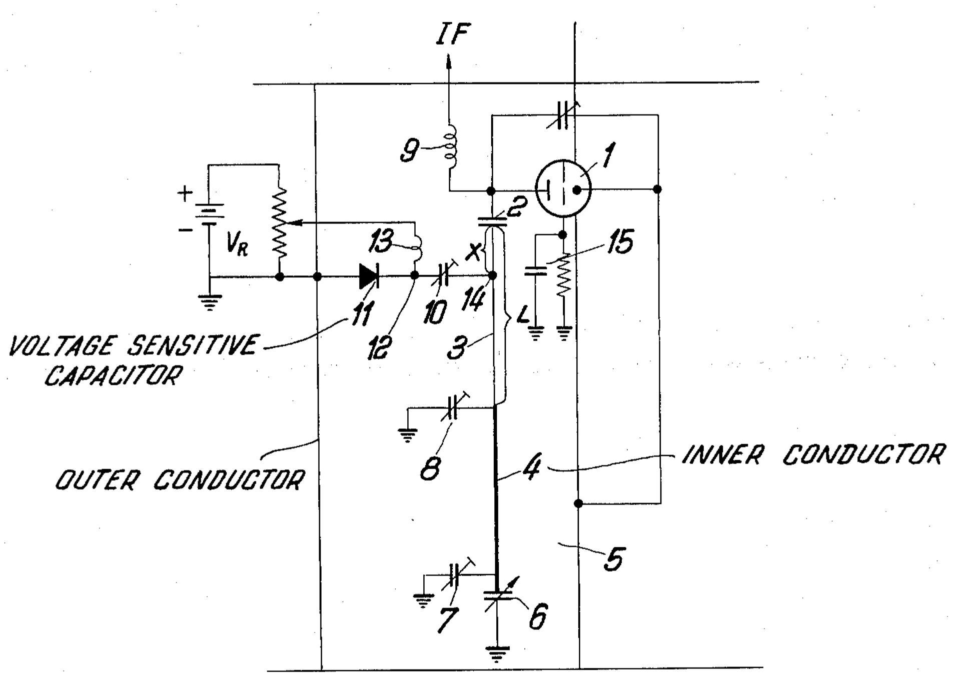
INVENTOR
Werner Bachnick
BY George H. Spencer
ATTORNEY United States Patent Office 3,204,198

Patented Aug. 31, 1965

3,204,198

CIRCUIT ARRANGEMENT FOR CHANGING THE OSCILLATOR FREQUENCY OF UHF TUNERS

Werner Bachnick, Gruneplan uber Alfeld (Leine), Germany, assignor to Telefunken Aktiengesellschaft, Berlin, Germany Filed Dec. 5, 1960, Ser. No. 73,574
Claims priority, application Germany, Dec. 11, 1959, T 17,580
3 Claims. (Cl. 331—101)

The present invention relates to a circuit arrangement for changing the oscillator frequency of UHF tuners in which the frequency determining circuit comprises a tuned tank circuit.

It is known in tuners of the above-mentioned type to use a silicon diode for fine tuning of the frequency of the oscillator, wherein the barrier layer capacitance is coupled across the oscillator tuned circuit. Inasmuch as the capacitance of the barrier layer is a function of the voltage thereacross, this capacitance can be varied with an appropriate bias voltage so as to obtain the desired frequency change. In order to keep the additional damping of the oscillator due to the diode resistance low, this diode is coupled relatively loosely to the tuned circuit. This is done because if the diode were coupled directly to the frequency determining tuned circuit of the UHF oscillator, then the circuit would, because of the very substantial resistive damping which arises, no longer work satisfactorily. In the known circuit, inductive coupling is accomplished by a coupling turn serving for transformation, which turn takes the form of a parallel inductance disposed next to the inner conductor of the tank circuit. The inductance is made more or less effective by changing the barrier layer capacitance of the diode. But this known circuit has the disadvantage that because it is coupled into a current antinode in the tuned circuit, the coupling loop will be definitely affected by the frequency changes. For this reason, the individual components of the coupling loop must be differently positioned with respect to the inner conductor of the oscillator circuit for different frequencies. But inasmuch as any change in the spacing between the inner conductor and the coupling loop also causes the oscillator frequency to vary, due to variations on the total inductance of the circuit, it is extremely difficult and time-consuming to align the oscillator and the input circuits for tracking, which is usually done by bending the segments of the variable rotating plate type condensers.

It is, therefore, an object of the present invention to provide a tuner which overcomes the above disadvantages and, with this object in view, the present invention resides in a circuit arrangement for varying the oscillator frequency of a UHF tuner containing a tank circuit by the use of the barrier layer capacitance of a crystal diode, wherein the diode is connected in series with a condenser which is preferably adjustable, and this series circuit is connected between ground, i.e., the wall of the tank circuit and a coupling conductor which connects the inner conductor of the tank circuit with the oscillator tube. By careful selection of the point of connection to said coupling conductor, it is possible to make the frequency varying effect of the circuit substantially constant throughout the entire frequency range of the tuned circuit. The degree of coupling is set once, during calibration by adjusting the said adjustable capacitor under conditions when the oscillator circuit is loaded as little as possible, this adjustment being made to compensate for the highest permissible mistuning of the circuit.

It is also possible, by appropriate selection of the point at which the connection is made between the coupling conductor and the series circuit comprising the diode and the adjustable capacitor, to obtain a substantially constant detuning effect throughout the entire frequency range of the oscillator due to the distributed self-inductance of the coupling conductor, connected between the tuned tank circuit which determines the frequency and the anode of the oscillator tube. If the distance between this connecting point and the oscillator tube is very large, there will be a larger frequency variation at lower frequencies than at higher frequencies. On the other hand, if the connecting point is moved relatively near to the oscillator tube, the frequency fluctuation will be greater at higher frequencies than at lower frequencies. Between these two extremes near the center of the conductor, the effect can be made constant over the band so that it can be easily tuned out.

Additional objects and advantages of the present invention will become apparent upon consideration of the following description when taken in conjunction with the accompanying drawing, in which the single figure is a schematic diagram showing a circuit according to the present invention.

Referring now to the drawing, the diagram illustrates an oscillator circuit of a UHF tuner incorporating an oscillator tube 1 whose anode is connected to the inner conductor 4 of a tank circuit 5 by way of a condenser 2 and a connecting conductor 3. One end of the inner conductor 4 is grounded to the end wall of the outer conductor of the tank circuit 5 which houses the circuit by way of a variable rotating plate type condenser 6 by means of which the tank circuit is tuned within the receiving band to obtain the desired IF. Additionally, a point near the end of the inner conductor 4 is grounded by a trimmer condenser 7. The other end of the inner conductor 4 is coupled to ground by way of a further trimmer condenser 8, the purpose of this additional trimmer condenser being to adjust the voltage curve of the tuned loop at the lowest frequency of the oscillator. In the illustrated embodiment, the oscillator tube 1 is represented as a self-oscillating mixing stage, wherein the intermediate frequency IF can be taken from the anode by way of a choke 9. It is, however, not an absolutely essential feature of the present invention that the oscillator tube 9 be in the form of a self-oscillating mixing stage; it suffices if the oscillator tube serves only to produce the oscillator frequency.

For mounting purposes, the conductors 3 and 4 can be made in one piece and of the same or different diameters. In the drawing, the length L of the conductor is shown smaller in diameter than the length of the conductor 4. The length L of the conductor 3 depends on the type of the tube 1 and should be selected such as to secure the oscillation produced by the tube at the high frequency end.

The present novel tuning circuit, comprising a condenser 10 and a diode 11 serving for the purpose of automatically correcting the frequency of the oscillator, has one end connected to the inner conductor at a point spaced the distance $x$ from the condenser 2 and the other end of this series circuit is grounded. The point 12 between the condenser 10 and the diode 11 is connected, preferably by way of a choke 13, to a regulated D.C. control voltage source $V_R$. The diode 11 is so selected and reverse-biased as to be operated in its blocked condition so that it changes its capacitance upon variation of the bias voltage. For this purpose, a silicon diode, for example, Telefunken type BA101, may be used. By appropriately selecting the location of the point 14 at which the series circuit 10, 11 is connected to the conductor 3, the amount of frequency variation of the oscillator frequency, for a particular control bias voltage on the diode 11, can be made substantially constant throughout the entire receiver tuning range of, for example, 470 to 790 megacycles. During the selection of the distance $x$ it will also be necessary to consider the distributed tube capacitances and the inductances of the circuit.

In one practical embodiment of the present invention, wherein the oscillator tube 1 was a Telefunken type PC86, corresponding to United States type 4CM4, the tube capacitances and distributed inductances were such that for $\lambda=37$ cm. (high frequency end) and $L=17$ mm., $x$ was selected to be approximately 8 mm. It should be noted that the series connection sequence of the diode and condenser is not critical, i.e., that it is possible to connect the diode 11 to the line 3 and to ground the capacitor 10.

As stated above, variation in the barrier layer capacitance causes at least some variation in the damping effect which the diode has on the oscillator tuned circuit. According to another feature of the present invention, therefore, the oscillator circuit can be stabilized against such variations by making the bias of the oscillator tube dependent on the control voltage for the diode 11, so that the tube can be driven at greater or lesser amplitude depending on the control voltage. This can be done, for example, by an RC-circuit 15 incorporated in the grid circuit of the oscillator tube 1.

It will be understood that the above description of the present invention is susceptible to various modifications, changes and adaptations, and the same are intended to be comprehended within the meaning and range of equivalents of the appended claims.

I claim:

1. In a UHF tuner incorporating (a) a tank circuit having an outer wall and a central conductor, (b) an oscillator tube having first, second and third electrodes, said first electrode being connected to said outer wall of said tank circuit and said second electrode being connected to a reference potential, and (c) a connector leading from the central conductor to said third electrode of the oscillator tube, the improvement which comprises fine tuning means for changing the oscillator frequency by using the variable barrier layer capacitance of a controlled diode, said tuning means being a series circuit composed of said diode and a condenser, which series circuit is interposed between the wall of the tank circuit and a point of the connector located approximately at the midpoint thereof, in consequence of which the frequency deviation is substantially constant over the entire tuning range of the UHF tuner.

2. The improvement defined in claim 1, further comprising self-biasing means connected across the second electrode of the tube, and said outer wall of said tank circuit, said self-biasing means being R.C. means proportioned to maintain the amplitude of oscillation constant over the tuning range of the tuner despite variations in the diode bias voltage.

3. The improvement defined in claim 1 wherein said condenser is adjustable to control the over-all amount of frequency deviation caused by changing the bias across the diode by a predetermined amount.

References Cited by the Examiner

UNITED STATES PATENTS

| | | | |
|---|---|---|---|
| 2,428,272 | 9/47 | Evans | 333—82 X |
| 2,701,842 | 2/55 | Hagopian | 331—101 X |
| 2,740,889 | 4/56 | Eckert | 334—45 X |
| 2,811,647 | 10/57 | Nilssen | 331—36 X |
| 2,826,687 | 3/58 | Fisher | 334—45 X |
| 2,936,428 | 5/60 | Schweitzer | 331—36 X |

OTHER REFERENCES

"AFC Circuit for UHF Oscillator," by Lynn, RCA Technical Notes (RCA TN No. 225).

ROY LAKE, *Primary Examiner.*

HERMAN KARL SAALBACH, JOHN KOMINSKI, *Examiners.*